United States Patent [19]

Zejda

[11] Patent Number: 5,611,858
[45] Date of Patent: Mar. 18, 1997

[54] APPARATUS FOR TRANSPORTING DISCOIDAL SUBSTRATES IN A VACUUM COATING APPARATUS

[75] Inventor: Jaroslav Zejda, Rodenbach, Germany

[73] Assignee: Leybold Aktiengesellschaft, Hanau, Germany

[21] Appl. No.: 317,715

[22] Filed: Oct. 4, 1994

[30] Foreign Application Priority Data

Dec. 7, 1993 [DE] Germany .......................... 43 41 634.9

[51] Int. Cl.⁶ .................................................... B65G 49/07
[52] U.S. Cl. ............................ 118/50; 118/500; 118/729; 118/730; 198/626.1; 198/817; 414/217
[58] Field of Search ........................... 118/500, 50, 729, 118/730; 198/626.1, 817; 414/217

[56] References Cited

U.S. PATENT DOCUMENTS

| | | | |
|---|---|---|---|
| 4,047,624 | 9/1977 | Dorenbos | 118/729 |
| 4,290,734 | 9/1981 | Van Breen | 414/786 |
| 4,430,149 | 2/1984 | Berkman | 156/613 |
| 4,484,538 | 11/1984 | Sarkozy et al. | 118/729 |
| 4,712,361 | 12/1987 | Oberoi | 53/540 |
| 4,795,022 | 1/1989 | Simmons | 198/462 |
| 4,805,759 | 2/1989 | Rochet et al. | 198/346.1 |
| 4,806,225 | 2/1989 | Fazlin et al | 204/298 |
| 4,832,179 | 5/1989 | Simmons | 198/461 |
| 4,938,649 | 7/1990 | ter Horst et al. | 414/412 |
| 4,947,784 | 8/1990 | Nishi | 414/404 |
| 5,153,841 | 10/1992 | Goff et al. | 364/478 |
| 5,324,957 | 6/1994 | Hejazi | 250/589 |

FOREIGN PATENT DOCUMENTS

| | | |
|---|---|---|
| 0150889 | 8/1985 | European Pat. Off. . |
| 3516853 | 11/1985 | Germany . |
| 9111797 | 1/1992 | Germany . |
| 43722 | 8/1992 | Japan . |
| 2170164 | 7/1986 | United Kingdom . |

Primary Examiner—Long V. Le
Attorney, Agent, or Firm—Felfe & Lynch

[57] ABSTRACT

In an apparatus for the transport of discoidal substrates (3, 3',...) through a treatment station or from a first to a second processing station (4 and 5, respectively) of a vacuum coating apparatus a motor unit (6) is provided, having three planar, positive conveyors driven by the latter, each having at least two sprockets (10, 10' and 12, 12') and a cogbelt (13, 14) guided over each sprocket pair, two of these conveyors being disposed to one another such that their sprockets (10, 10') extend in a common plane, the sprockets (12, 12') of a third conveyor extending in a plane which runs at right angles to the plane of the sprockets (10, 10') of the other two conveyors, and all three of the parallel strands of the three conveyors, which are at an angle to one another, being tangent to the outside edge of circular discoidal substrates (3, 3', ... ) whose diameters correspond to the distance which the other two parallel strands of the first two conveyors have from one another and which extend in planes running across these strands, the cogbelts (13, 14) of the three conveyors being provided on their confronting outside surfaces with transversely running ribs or cleats whose number and distances apart correspond in each case to those of the cogs of the cogbelts which engage the sprockets.

3 Claims, 3 Drawing Sheets

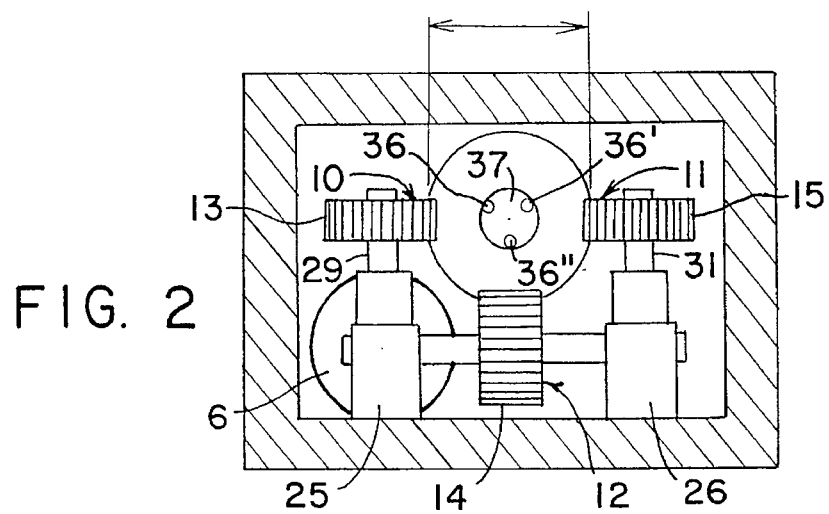
FIG. 2
FIG. 3
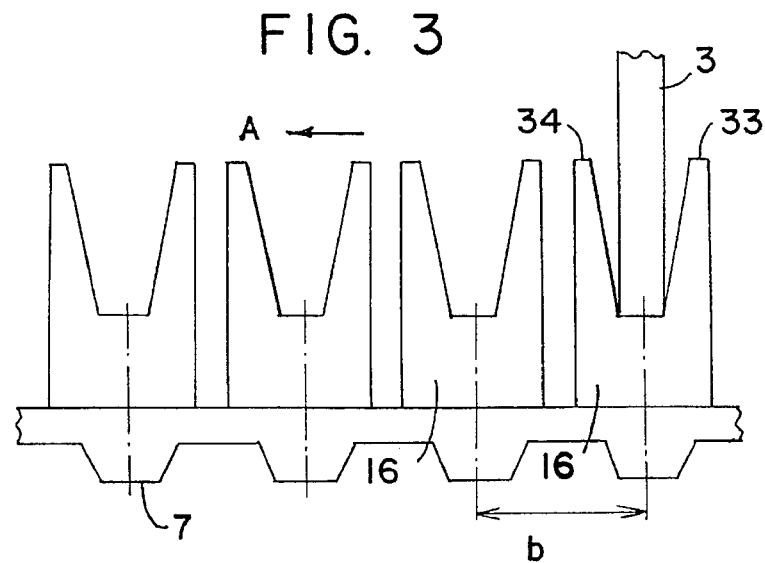
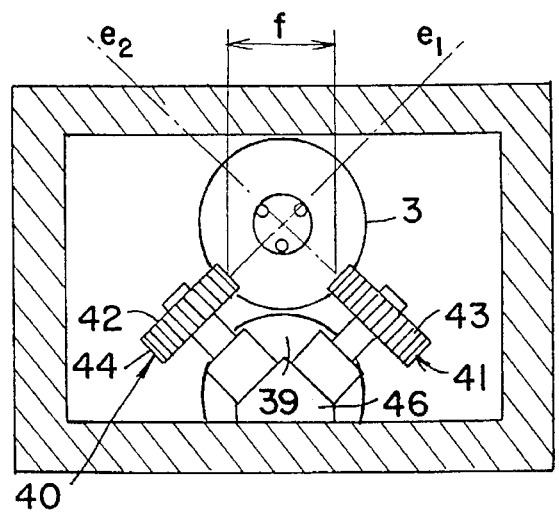
FIG. 4

APPARATUS FOR TRANSPORTING DISCOIDAL SUBSTRATES IN A VACUUM COATING APPARATUS

BACKGROUND OF THE INVENTION

The invention relates to an apparatus for transporting discoidal substrates through a treatment station or from a first to a second processing station of a vacuum coating apparatus.

Apparatus are known, with which an especially rapid transport of substrates can be performed (German application P 43 36 792.5).

The purpose of the present invention is to provide an apparatus for transporting discoidal substrates, which on the one hand can be inserted into a production line that operates at a very high cycling speed, but which on the other hand permits the substrate to dwell a long time in an additional treatment chamber. The apparatus is to be associated with a sputtering apparatus, for example, which permits rapid coating of the substrates, but the substrates are to be exposed before the coating process to a comparatively slow degassing treatment.

SUMMARY OF THE INVENTION

This purpose is accomplished by a motor unit driving three planar, positive conveyors, each having a cogbelt carried over a pair of sprockets, two of these conveyors being associated with one another such that their sprockets extend in a common plane and their cogbelts extend with at least one strand parallel to and spaced apart from the other, and the sprockets of a third conveyor extend in a plane running at right angles to the plane of the sprockets of the other two conveyors. At least one strand of the third conveyor runs parallel to the strands of the other two conveyors, and all three parallel strands of the three conveyors at an angle toward one another are tangent to the outside edges of the discoidal substrates whose diameter corresponds to the distance between the two strands of the first two conveyors and which are disposed in planes at right angles to the strands, while the cogbelts of the three conveyors are provided on their confronting outside faces with transverse cleats or teeth whose spacing and number correspond to those of the teeth of the cogbelts which mesh with the sprockets.

Alternatively, this purpose is achieved by a motor unit driving two planar, positive conveyors, each with at least two sprockets, with a cogbelt passing over each pair of sprockets, the two conveyors being disposed with respect to one another such that each of their cogbelts runs with at least with one strand parallel to and spaced apart from the other, and that the one pair of sprockets extends in a first plane that is at an angle to a second plane in which the other pair of sprockets extends, the distance between the two parallel strands of the two conveyors being such that the discoidal substrates lie with their radially outer margin portions against the strands which are disposed transversely of the two planes of the cogbelts, the substrates being held by cleats which are provided on the outer surfaces of the cogbelts and extend across their length.

BRIEF DESCRIPTION OF THE DRAWINGS

FIG. 2 is a sectional view of the apparatus in a section taken along lines A—A of FIG. 1, FIG. 3 is an enlarged side view of a portion of a cogbelt, and FIG. 4 is a sectional view with a section taken transversely through an alternative embodiment with two conveyors.

DESCRIPTION OF THE PREFERRED EMBODIMENT

Figure 1:
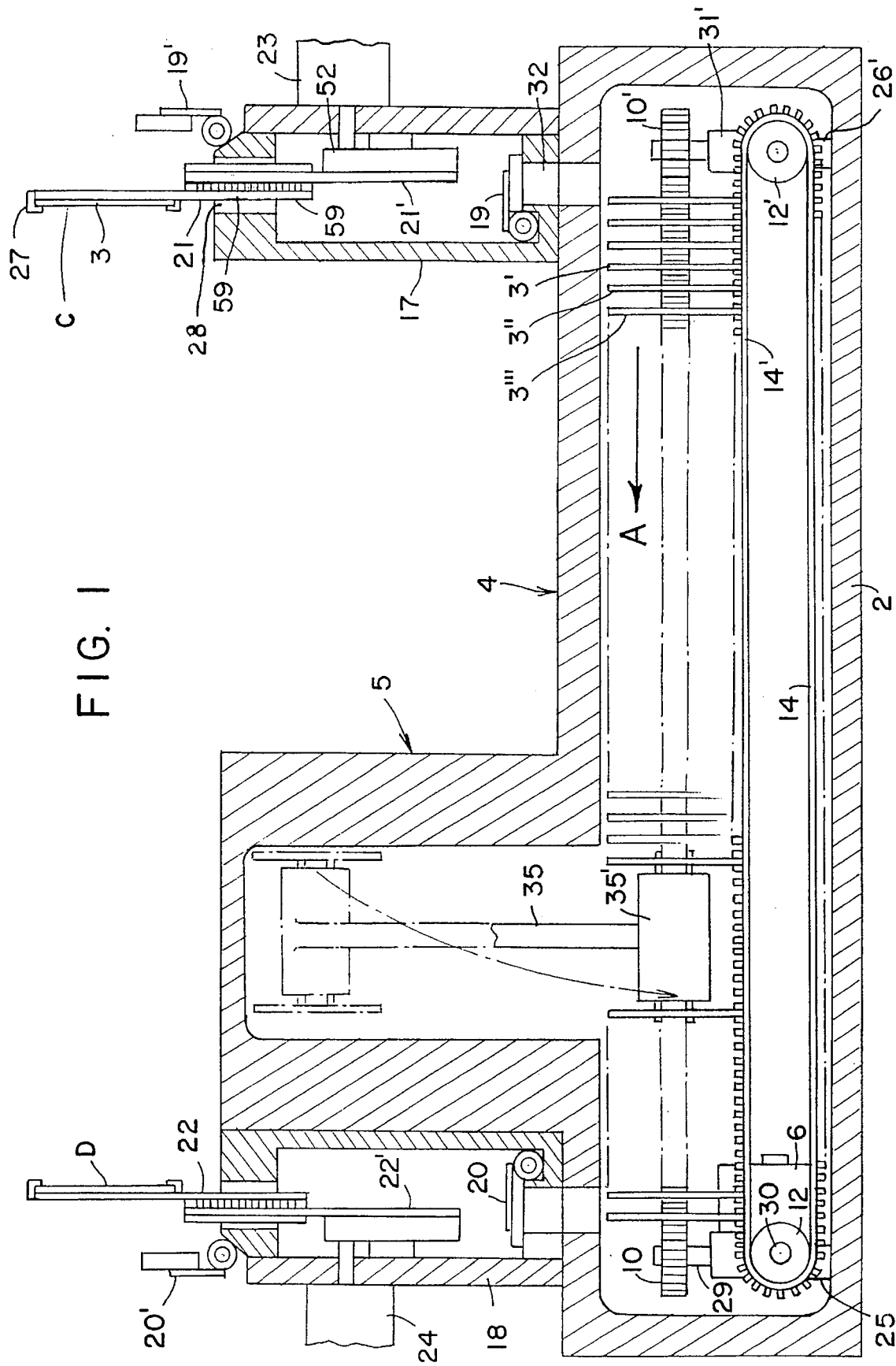
FIG. 1 shows a longitudinal section through the apparatus according to the invention, with an entry airlock station, two processing stations, and an exit airlock station.

The apparatus includes essentially of a vacuum-tight chamber 2 with the two processing stations 4 and 5, an entry airlock chamber 17, an exit airlock chamber 18, the airlock valves 19, 19' and 20, 20', the transport lever pairs 21, 21', 22, 22', movably mounted in the entry and exit lock chambers 17 and 18, respectively, the motors 23 and 24 for the transport arms 21 and 22, the gearing 25, 26 and 26', the sprockets 10, 11, 12 and 10', 12' rotating with the drive shafts 29, 30, 31 and 30', 31', and the three cogbelts 13,14,15 stretched over the sprockets 10 and 10', 10 and 12', 11 and 11' (not shown), and the motor 6 coupled to the gearing 25, 26.

The apparatus operates as follows: The substrate 3 is picked up by a substrate holder 27 from a supply stack and then carried by the transport arm pairs 21, 21' past the opened entry airlock valve 19' through the elongated slot entry airlock opening 28 into the entry airlock chamber 17, the pairs of arms being operated by the motor 23. After the closing of the airlock opening 28 by the airlock valve 19' and the subsequent uncovering of the elongated airlock opening 32 and the further transport of the substrate 3 into the chamber 2, the substrate is deposited on the cogbelt 14 on its upper strand 14'and is centered between two cleats 33, 34 of a holder 16 (see FIG. 3). The substrate 3 at the same time slips down into the corresponding cleats of the other two adjacent cogbelts 13, 15, so that it is held and carried in a vertical position at a total of three points by the three pair of cleats on the three cogbelts 13, 14 and 15. After the deposition of the substrate 3 on the upper strand 14' of the cogbelt 14, the transport arm pairs 21 and 21' move back to the starting position (as shown in FIG. 1), and airlock opening 32 is closed again and airlock opening 28 is opened again. Simultaneously with the return of the transport arm pairs 21 and 21' the conveyors advance, i.e., the motor 6 rotates the three sprockets 10, 11 and 12 synchronously, to the point where the three cogbelts 13, 14 and 15 advance in arrow direction A by the distance "b" between each pair of holder 16, whose number and spacing "b" correspond to the number and spacing of the cogs 7 which engage the sprockets 10, 11, 12. After a great number of advances or transport steps, the substrate 3 comes within reach of the transport arm 35 which with three pins 36, 36', 36" reaches into a central opening 37 of the discoidal substrate 3 and then swings it in synchronism with the transport steps to the position (represented in broken lines) for processing in the treatment chamber 5. Since during its swinging movement the head piece 35' of the transport arm 35 rotates, when the treatment in the processing station 5 is completed the return of the transport arm 35 brings the substrate to a position at the head part (as seen in arrow direction A) and there it is replaced on the cogbelt 14. From this point the substrate is transported step-wise until it finally comes within reach of the transport arm pair 22, 22' driven by motor 24, and then is carried from there through the exit lock chamber 18 via valves 20, 20' to position D; the entire exit lock system is designed precisely for this purpose and operates in the same manner as the entry lock apparatus described above with the arm pairs 21 and 21'. A more detailed illustration and description of the operation of the transport arm pairs is to be found in the German patent application P 43 36 792.5 and will now be described with reference to FIG. 5.

Figure 5:
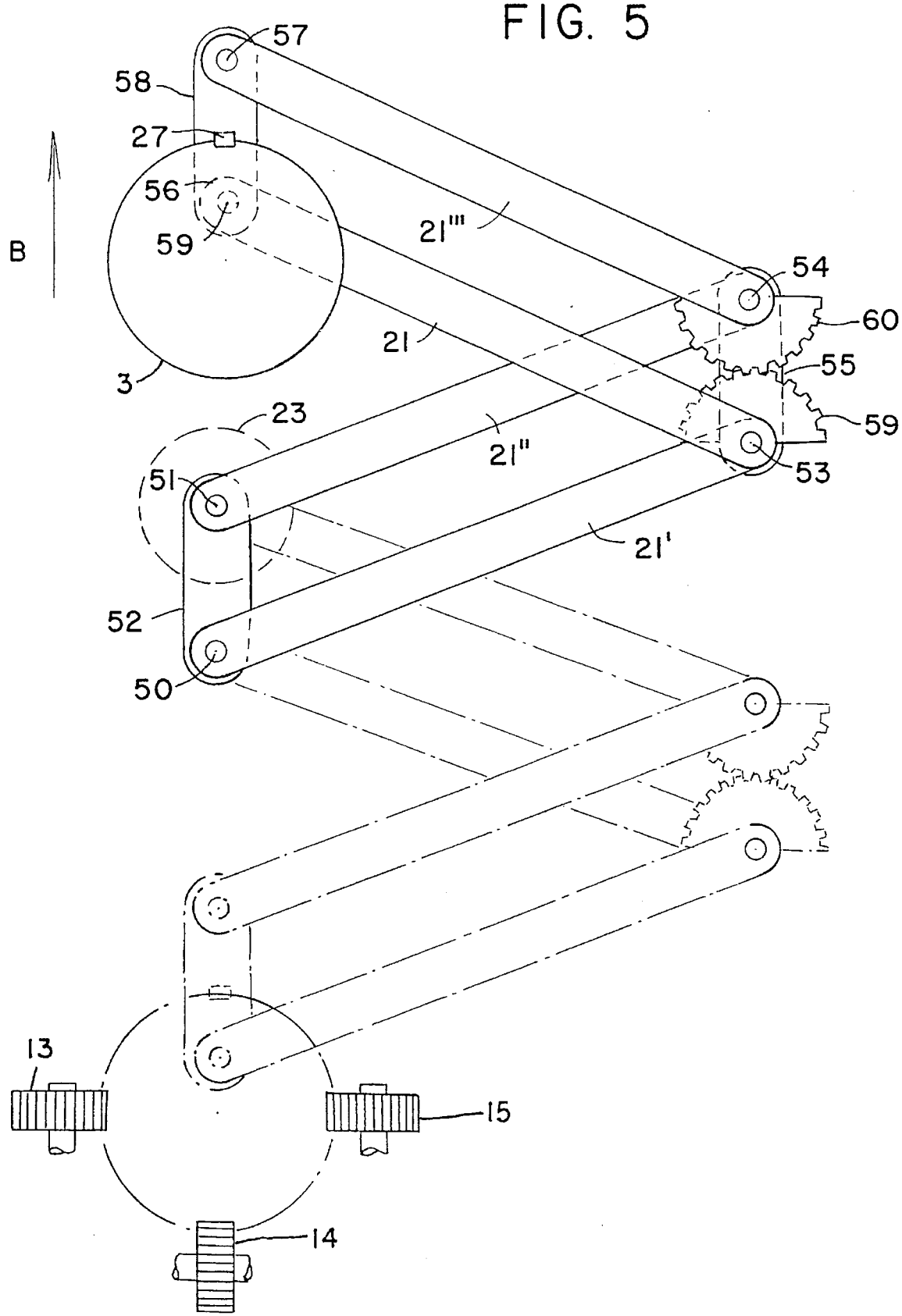
FIG. 5 is a side elevational view, partly schematic, of transport arms and apparatus for vertical movement of a substrate.

The FIG. 5 apparatus comprises a first pair of equally long arms 21', 21" parallel to one another, each of them held by one end for pivoting under drive of motor 23, about pins 50, 51 on a fixed bearing plate 52 on the machine frame. The ends of arms 21', 21" remote from the pins 50, 51 are held on the pins 53, 54 on a second bearing plate or link 55. Also pivoted on pins 53, 54 is a second pair of parallel arms 21, 21''' of equal length, whose ends remote from pins 53, 54 are pivoted on pins 56, 57 on a third bearing plate 58. The third bearing plate 58 is fixedly joined to the substrate holder 27. On the arm 21' of the first pair of arms 21', 21", a first gear sector 59 is disposed nonrotatably; it is engaged with a second gear sector 60 which is joined nonrotatably to the arm 21''' of the second arm pair 21, 21'''.

If the first arm pair 21', 21" is swung in the direction of arrow B, i.e., upwardly, by means of the drive shaft of motor 23, which is nonrotatably attached to the arm 21, the gear sectors 53, 54, which mesh with one another, bring it about that the second arm pair 21, 21''' will be driven upwardly in the direction of arrow B, along a straight line running through the pins 50, 51, and 57, 59, while the arms 21, 21" will perform a swinging movement relative to the bearing plate 52.

If the arm pair 21', 21''' is then swung downwardly by means of the motor 23 to the position shown in broken lines, the above-described movements will be performed in reverse and the substrate holder 27 will reach a position on belt 14. On the way from the uppermost position to the down position the substrate holder 27 moves along a straight path, and the substrate will retain the attitude it first assumed to the path of movement.

In the embodiment shown in FIG. 4, a motor 39 is provided which through the gear transmission unit 46 drives the two cogbelts 40 and 41 and their sprockets 42 and 43. The axes of the sprockets 42 and 43 are at an angle, a right angle for example, to one another, and the sprockets 42 and 43 extend in the planes $e_1$ and $e_2$, and the radially outer marginal portion of the substrate 3 lies against the two cogbelts 40 and 41 guided over the sprockets 42 and 43. The distance f between the points of contact of the two cogbelts 40 and 41 is best made substantially less than the diameter of the substrate 3.

While there has been described what is at present believed to be the preferred embodiment of the invention, it will be obvious to those skilled in the art that various changes and modifications may be made therein without departing from the invention, and it is, therefore, aimed to cover all such changes and modifications as fall within the true spirit and scope of the invention.

I claim:

1. Apparatus for transporting discoidal substrates from a first processing station to a second processing station, said apparatus comprising a first cogbelt on a pair of first sprockets, said first cogbelt comprising a pair of first strands extending between said first sprockets and having pairs of outward facing cleats extending transversely of said first strands, a second cogbelt on a pair of second sprockets, said second cogbelt comprising a pair of second strands extending between said second sprockets and having pairs of outward facing cleats extending transversely of said second strands, one of said first strands being movable in a direction and one of said second strands being in facing relationship with said one of said first strands and movable in said direction, each pair of cleats of said one of said first strands being directly opposed from a pair of cleats of said one of said second strands, said directly opposed pairs of cleats being spaced to receive a discoidal substrate therebetween, said one of said first strands and said one of said second strands facing upward so that said strands can support a discoidal substrate therebetween, each pair of cleats having a point of contact with said discoidal substrate, the points of contact in directly opposed pairs being spaced apart by a distance substantially less than the diameter of the substrate, and means for synchronously driving said first and second cogbelts.

2. Apparatus as in claim 1 wherein each cogbelt has inward facing cogs which engage respective said sprockets, the cogs of each belt corresponding in number and spacing to the pairs of cleats on said each belt.

3. Apparatus for transport of discoidal substrates comprising;

first and second processing stations (4 and 5) of a vacuum coating apparatus; a motor unit (6) with three sprocket pairs (10, 10' and 11, 11' and 12, 12') driven thereby and with a cogbelt (13, 14, 15) having cogs guided over each sprocket pair, a first two of said sprocket pairs (10, 10 and 11, 11') extending in a common plane, a third sprocket pair (12, 12') extending in a plane which runs at right angles to the plane of said first two sprocket pairs (10, 10' and 11, 11'), each cogbelt having at least one strand running parallel to said at least one strand of the other two cogbelts, and all three of the parallel strands being tangent to discoidal substrates having diameters which correspond to a distance (a) between the two parallel strands of the cogbelts of the first two sprocket pairs, the cogbelts (13, 14, 15) being provided on confronting outside surfaces thereof with transversely running cleats whose spacing and number correspond each to those of the cogbelt cogs which engage the sprockets.

\* \* \* \* \*